(12) United States Patent
Ma et al.

(10) Patent No.: US 11,581,283 B2
(45) Date of Patent: Feb. 14, 2023

(54) FLIP CHIP PACKAGE AND CIRCUIT BOARD THEREOF

(71) Applicant: CHIPBOND TECHNOLOGY CORPORATION, Hsinchu (TW)

(72) Inventors: Yu-Chen Ma, Kaohsiung (TW); Hsin-Hao Huang, Kaohsiung (TW); Wen-Fu Chou, Kaohsiung (TW); Gwo-Shyan Sheu, Kaohsiung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 284 days.

(21) Appl. No.: 16/910,461

(22) Filed: Jun. 24, 2020

(65) Prior Publication Data
US 2021/0202422 A1    Jul. 1, 2021

(30) Foreign Application Priority Data

Dec. 31, 2019 (TW) ................. 108148760

(51) Int. Cl.
*H01L 23/00* (2006.01)
*H01L 23/538* (2006.01)
*H01L 23/498* (2006.01)

(52) U.S. Cl.
CPC ............ *H01L 24/14* (2013.01); *H01L 23/498* (2013.01); *H01L 23/5386* (2013.01)

(58) Field of Classification Search
CPC ........... H01L 23/5386; H01L 23/49838; H01L 24/81; H01L 24/14; H01L 23/498;

(Continued)

(56) References Cited

U.S. PATENT DOCUMENTS

| 5,661,831 A * | 8/1997 | Sasaki ................. G02B 6/4232 385/88 |
| 6,255,729 B1 * | 7/2001 | Oikawa .................. H01L 24/49 257/691 |

(Continued)

FOREIGN PATENT DOCUMENTS

| CN | 103178035 | * | 6/2013 | ............. H01L 24/29 |
| CN | 103178035 A | * | 6/2013 | ............. H01L 24/29 |

(Continued)

OTHER PUBLICATIONS

Taiwanese Office Action dated Jun. 9, 2020 for Taiwanese Patent Application No. 108148760, 12 pages.

(Continued)

*Primary Examiner* — Alexander O Williams
(74) *Attorney, Agent, or Firm* — Demian K. Jackson; Jackson IPG PLLC

(57) ABSTRACT

A flip chip package includes a circuit board, a chip and a solder layer. The chip is mounted on an inner bonding area of the circuit board. The solder layer is located between the circuit board and the chip for bonding bumps to inner leads and a T-shaped circuit unit is on the inner bonding area. The T-shaped circuit unit has a main part, a connection part, and a branch part. The connection part is connected to the main and branch parts, respectively. The main part extends along a lateral direction and the branch part extends outwardly along a longitudinal direction. The connection part is narrower than the main part in width so as to inhibit solder shorts caused by solder overflow on the branch part.

17 Claims, 6 Drawing Sheets

(58) Field of Classification Search
CPC ..... H01L 23/49816; H01L 2224/81815; H01L 2224/81986; H01L 2224/81203; H01L 23/00; H01L 23/538; H01L 2224/814; H01L 24/16; H01L 2224/10175; H01L 2224/81191; H01L 2924/014
USPC ........................................................ 257/737
See application file for complete search history.

(56) References Cited

U.S. PATENT DOCUMENTS

| | | | | |
|---|---|---|---|---|
| 2008/0023828 | A1* | 1/2008 | Peng | H01L 24/13 257/737 |
| 2012/0073862 | A1* | 3/2012 | Muramatsu | H05K 1/0269 174/250 |
| 2012/0261689 | A1* | 10/2012 | Appelt | H01L 21/4832 257/E33.059 |
| 2013/0256878 | A1* | 10/2013 | Hsu | H01L 24/08 257/737 |
| 2015/0357291 | A1* | 12/2015 | Lin | H01L 23/49838 257/778 |
| 2016/0268991 | A1* | 9/2016 | Laighton | H01P 3/08 |
| 2021/0073862 | A1* | 3/2021 | Shaw | G06Q 30/0276 |
| 2021/0265255 | A1* | 8/2021 | Ma | H01L 24/17 |

FOREIGN PATENT DOCUMENTS

| | | | | |
|---|---|---|---|---|
| CN | 103367293 | * | 10/2013 | ............. H01L 24/09 |
| CN | 103367293 A | * | 10/2013 | ............. H01L 24/09 |
| JP | 2004-296718 A | | 10/2004 | |
| JP | 2005-167221 A | | 6/2005 | |
| JP | 2013-65673 A | | 4/2013 | |
| JP | 2014-27126 A | | 2/2014 | |
| JP | 2016-21543 A | | 2/2016 | |
| JP | 2019-161198 A | | 9/2019 | |
| KR | 10-2016-0020891 A | | 2/2016 | |
| TW | 200410611 A | | 6/2004 | |
| TW | 200812446 A | | 3/2008 | |

OTHER PUBLICATIONS

Korean Office Action dated Oct. 18, 2021 for Korean Patent Application No. 10-2020-0073577, 4 pages.
Japanese Office Action dated Sep. 16, 2021 for Japanese Patent Application No. 2020-104396, 4 pages.

* cited by examiner

FLIP CHIP PACKAGE AND CIRCUIT BOARD THEREOF

FIELD OF THE INVENTION

This invention relates to a flip chip package, and more particularly to a flip chip package having T-shaped circuit unit.

BACKGROUND OF THE INVENTION

Thermal compression is a common flip chip bonding technology, solid solder is heated and turned to softened solder for bonding chip and substrate. The softened solder on inner leads may flow toward bumps during thermal compression, however, solder on wider leads may be softened and flow toward bumps at a rapider speed to cause solder overflow around bump, even cause solder short to reduce product yield.

SUMMARY

One object of the present invention is to provide a flip chip package having T-shaped circuit unit. By reducing width of connection part of T-shaped circuit unit, solder short result from solder overflowing on T-shaped circuit unit can be prevented effectively.

A flip chip package of the present invention includes a circuit board, a chip and a solder layer. The circuit board includes a substrate, a plurality of inner leads and at least one T-shaped circuit unit. An inner bonding area is defined on a surface of the substrate and divided into a first inner bonding area and a second inner bonding area. The inner leads are located on the first inner bonding area and the at least one T-shaped circuit unit is located on the second inner bonding area. The at least one T-shaped circuit unit includes a main part, a connection part and a branch part, the main part is connected to the connection part and extends along a lateral direction, the branch part is connected to the connection part and extends toward the first inner bonding area along a longitudinal direction. Along the longitudinal direction, the main part has a first width and the connection part has a second width lower than the first width. The chip is mounted on the inner bonding area and includes a plurality of first bumps and at least one second bump. The solder layer is located between the circuit board and the chip and provided to connect the first bumps to the inner leads and connect the at least one second bump to the branch part.

A circuit board of the present invention includes a substrate, a plurality of inner leads and at least one T-shaped circuit unit. An inner bonding area is defined on a surface of the substrate and divided into a first inner bonding area and a second inner bonding area. The inner leads are located on the first inner bonding area and the at least one T-shaped circuit unit is located on the second inner bonding area. The at least one T-shaped circuit unit includes a main part, a connection part and a branch part, the main part is connected to the connection part and extends along a lateral direction, the branch part provided for bonding with a bump is connected to the connection part and extends toward the first inner bonding area along a longitudinal direction. Along the longitudinal direction, the main part has a first width and the branch part has a second width lower than the first width.

While the chip is bonded to the circuit board, the solder layer is heated and softened to flow to bonding site on the branch part. For this reason, the width of the connection part of the present invention is decreased to lower the solder amount flowing from the connection part to the branch part so as to effectively prevent solder short result from solder overflowing around the bonding site.

DETAILED DESCRIPTION OF THE INVENTION

Figure 1:
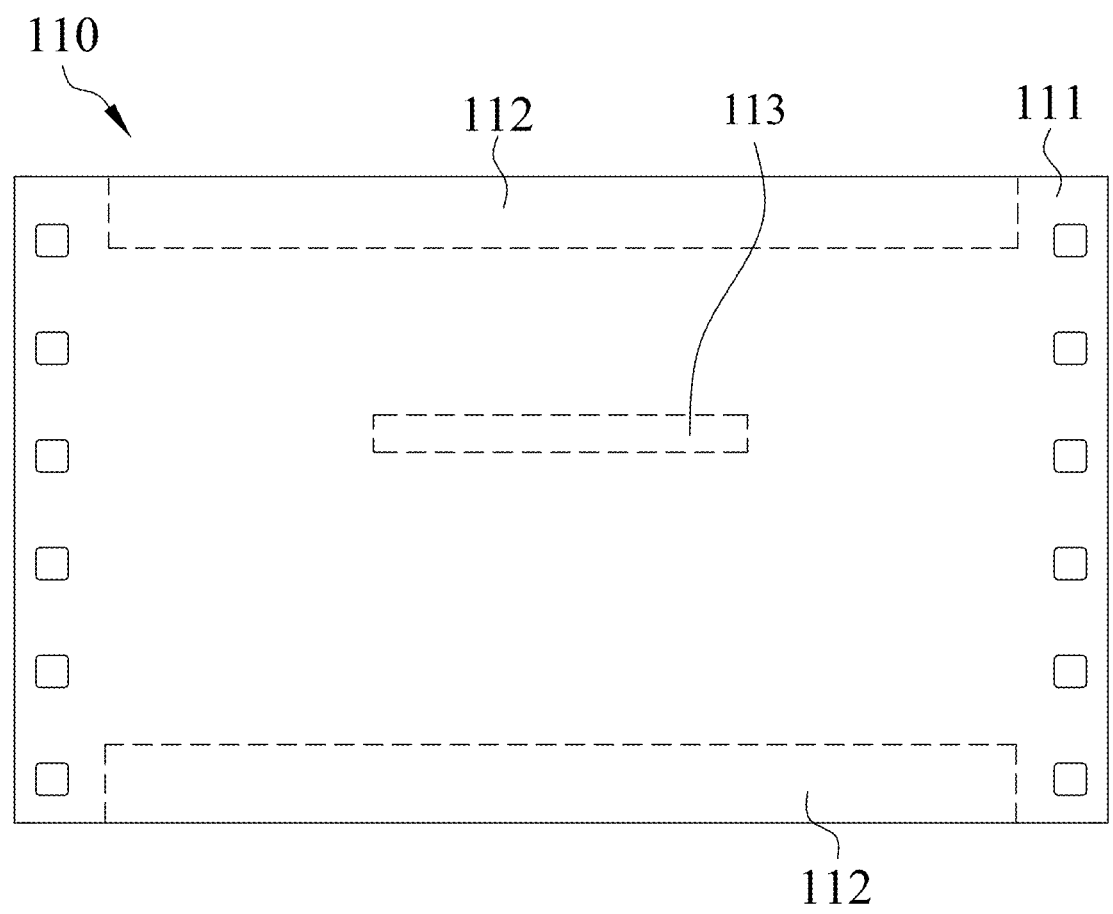
FIG. 1 is a top view diagram illustrating a substrate in accordance with an embodiment of the present invention.
Figure 2:
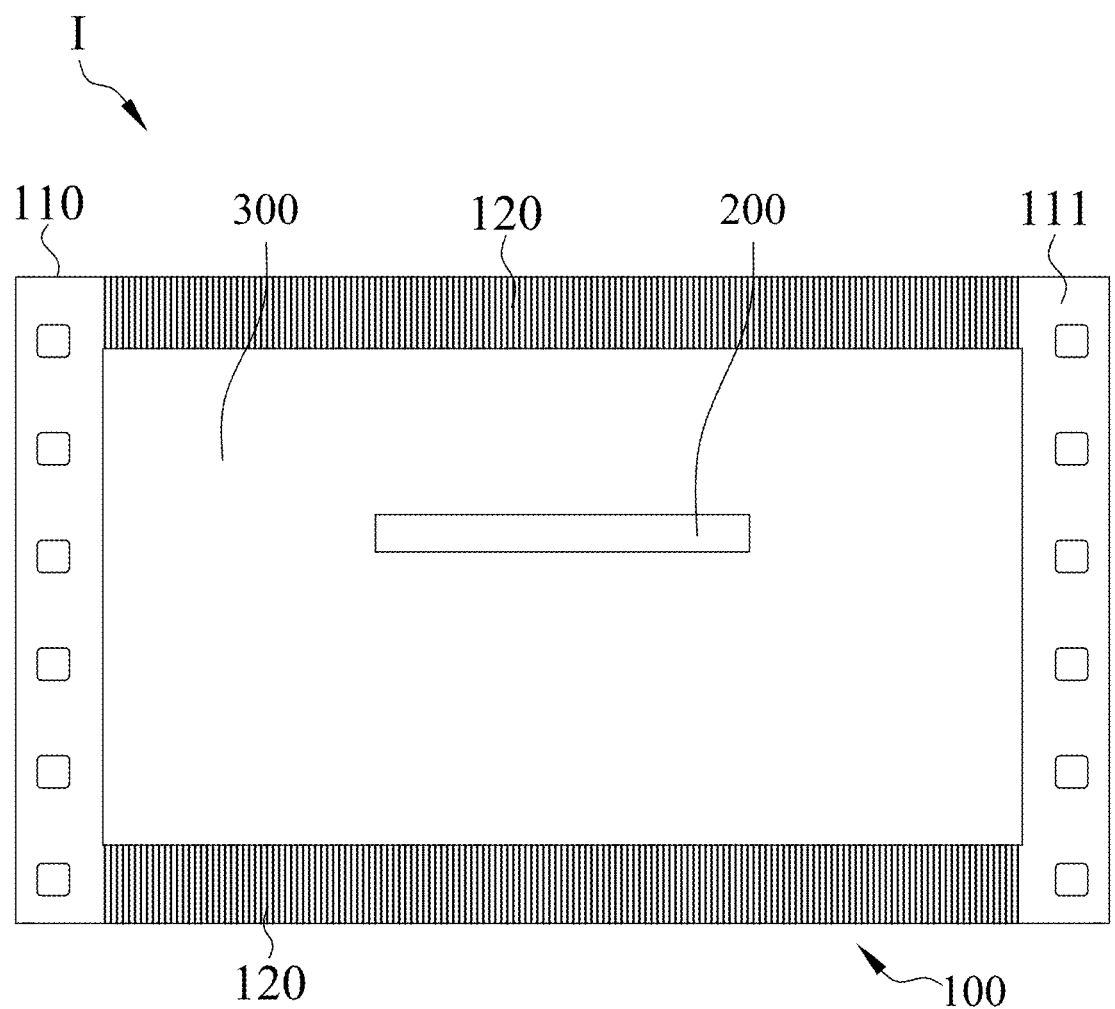
FIG. 2 is a top view diagram illustrating a flip chip package in accordance with an embodiment of the present invention.
Figure 3:
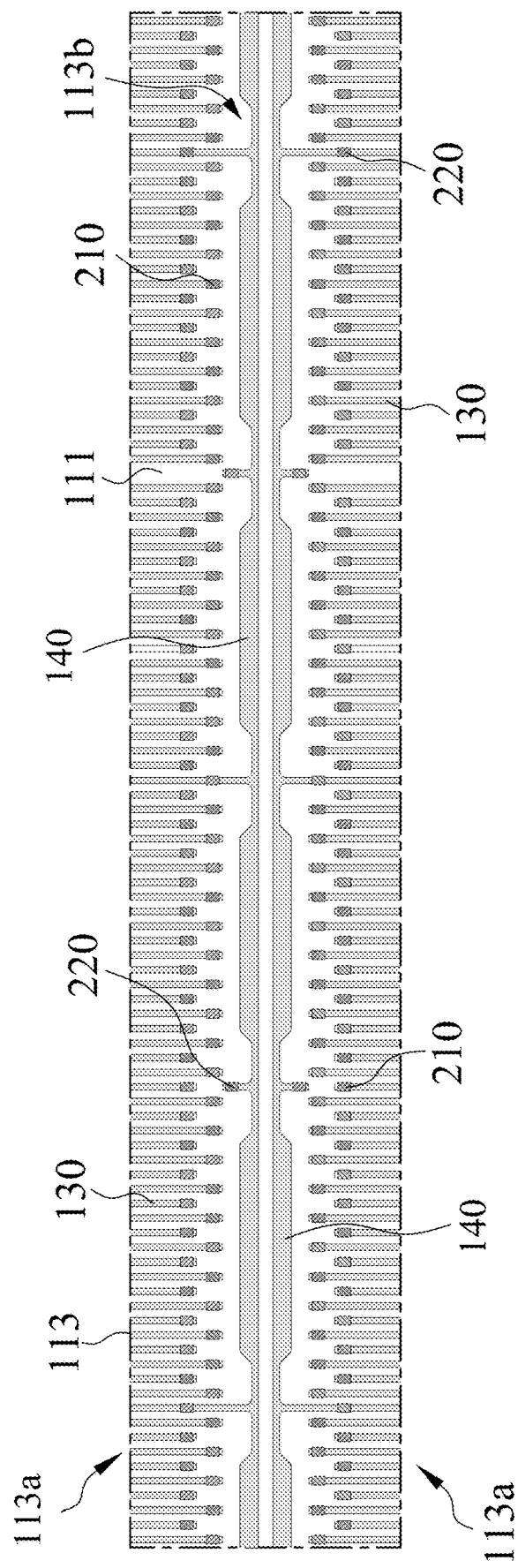
FIG. 3 is a partial top view diagram illustrating an inner bonding area of a circuit board in accordance with an embodiment of the present invention.

With reference to FIGS. 1 to 3, a flip chip package I of the present invention, which may be chip on film (COF), chip on glass (COG) or other interconnections, includes a circuit board 100 and a chip 200. The circuit board 100 includes a substrate 110, a plurality of outer leads 120 and a plurality of inner leads 130, and it may be made of polyimide (PI), polyethylene terephthalate (PET), glass, ceramics, metal or other materials. The outer leads 120 and the inner leads 130 are formed on a surface 111 of the substrate 110. Two outer bonding areas 112 and one inner bonding area 113 are defined on the surface 111, the outer bonding areas 112 are located on both sides of the substrate 110, respectively, and the inner bonding area 113 is located between the outer bonding areas 112. The outer leads 120 are located on the outer bonding areas 112 and the inner leads 130 are located on the inner bonding area 113.

With reference to FIGS. 2 and 3, the flip chip package I preferably further includes a solder resist layer 300 which covers the surface 111 of the substrate 110, except the outer bonding areas 112 and the inner bonding area 113. The chip 200 is mounted on the inner bonding area 113, and in one embodiment, the chip 200 is bonded to the inner leads 130 by thermal compression and an external device (not shown) is bonded to the outer leads 120.

Figure 4:
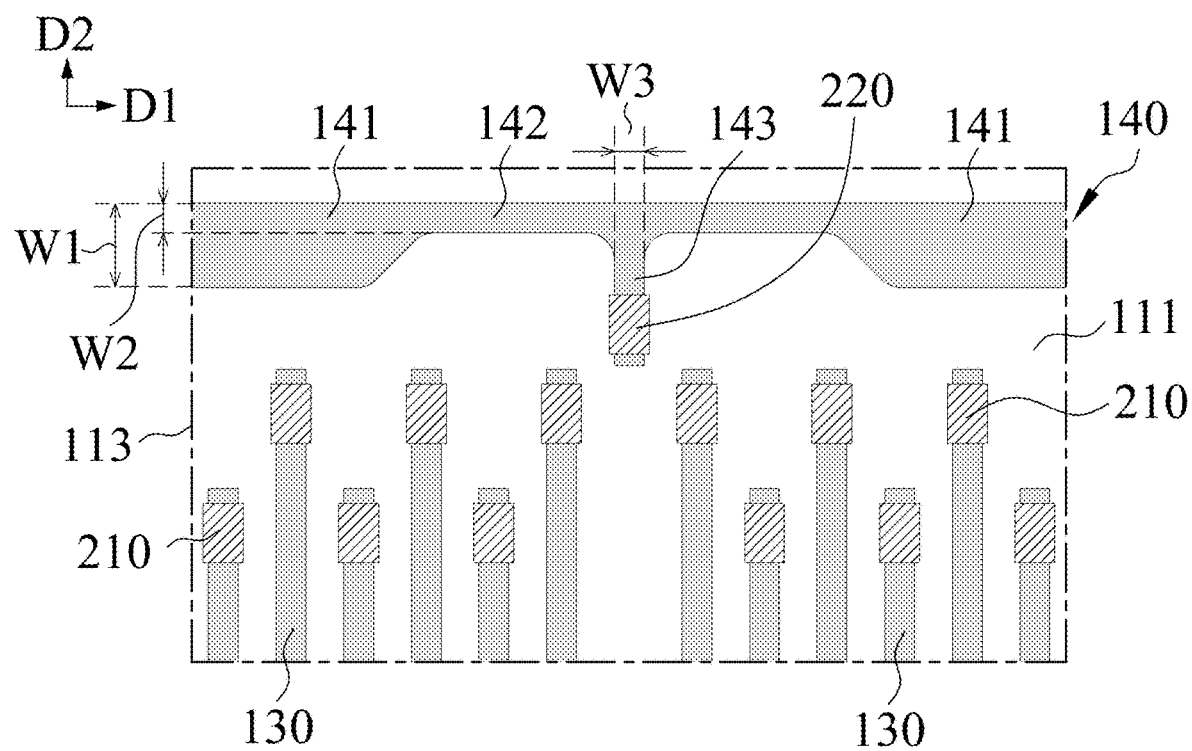
FIG. 4 is a partial top view diagram illustrating an inner bonding area of a circuit board in accordance with an embodiment of the present invention.

With reference to FIGS. 3 and 4, the inner bonding area 113 is divided into a first inner bonding area 113a and a second inner bonding area 113b, the inner leads 130 are located on the first inner bonding area 113a. The circuit board 100 further includes at least one T-shaped circuit unit 140 located on the second inner bonding area 113b. The T-shaped circuit unit 140 configured for ground connection or power connection is not electrically connected to the inner leads 130. Preferably, the inner bonding area 113 is divided into two first inner bonding areas 113a and one second inner bonding area 113b, the first inner bonding areas 113a are located on two sides, and the second inner bonding area 113b is located between the two first inner bonding areas 113a. The inner leads 130 are arranged along two opposite edges of the inner bonding area 113 and the T-shaped circuit unit 140 is located between the inner leads 130. Preferably, both of the inner leads 130 and the T-shaped circuit unit 140 are formed by micro etching of conventional copper clad laminate (CCL) substrate.

With reference to FIGS. 3 and 4, the T-shaped circuit unit 140 includes a main part 141, a connection part 142 and a branch part 143. The main part 141 is connected to the connection part 142 and extends outwardly along a lateral direction D1, and the branch part 143, used for bonding a bump of the chip 200, is connected to the connection part 142 and extends toward the first inner bonding area 113a along a longitudinal direction D2. In this embodiment, the connection part 142 and the branch part 143 are perpendicular to one another, but in other embodiments, the included angle between the connection part 142 and the branch part 143 may be higher, lower or equal to 90 degrees.

The circuit board 100 preferably includes a plurality of T-shaped circuit units 140, the main part 141 of each of the T-shaped circuit units 140 is connected to one other along the lateral direction D1, and the branch part 143 of each of the T-shaped circuit units 140 extends toward the first inner bonding area 113a, respectively, along the longitudinal direction D2.

Figure 5:
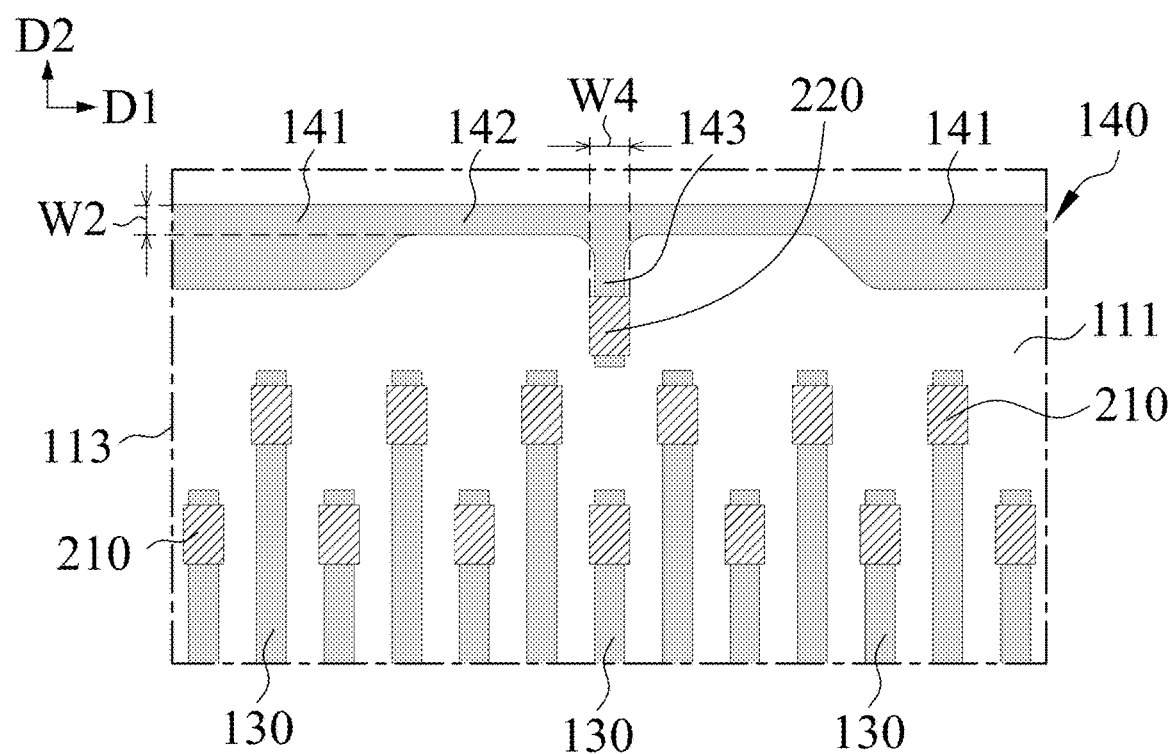
FIG. 5 is a partial top view diagram illustrating an inner bonding area of a circuit board in accordance with an embodiment of the present invention.
Figure 6:
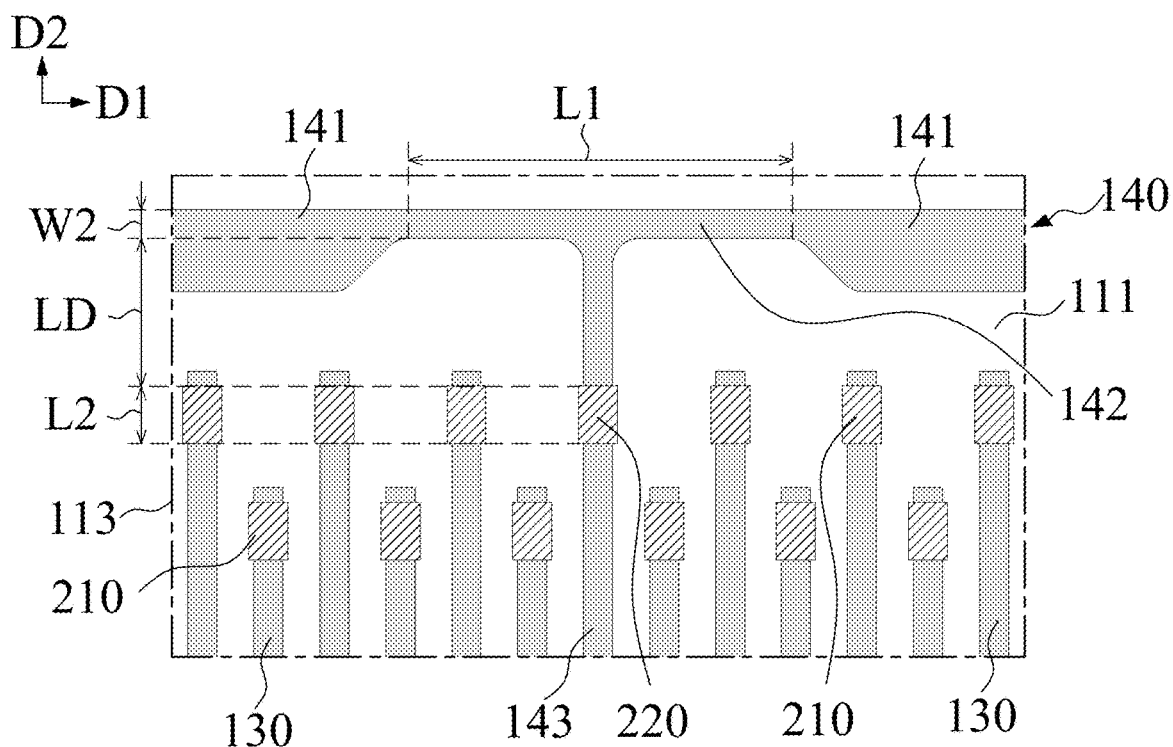
FIG. 6 is a partial top view diagram illustrating an inner bonding area of a circuit board in accordance with an embodiment of the present invention.
Figure 7:
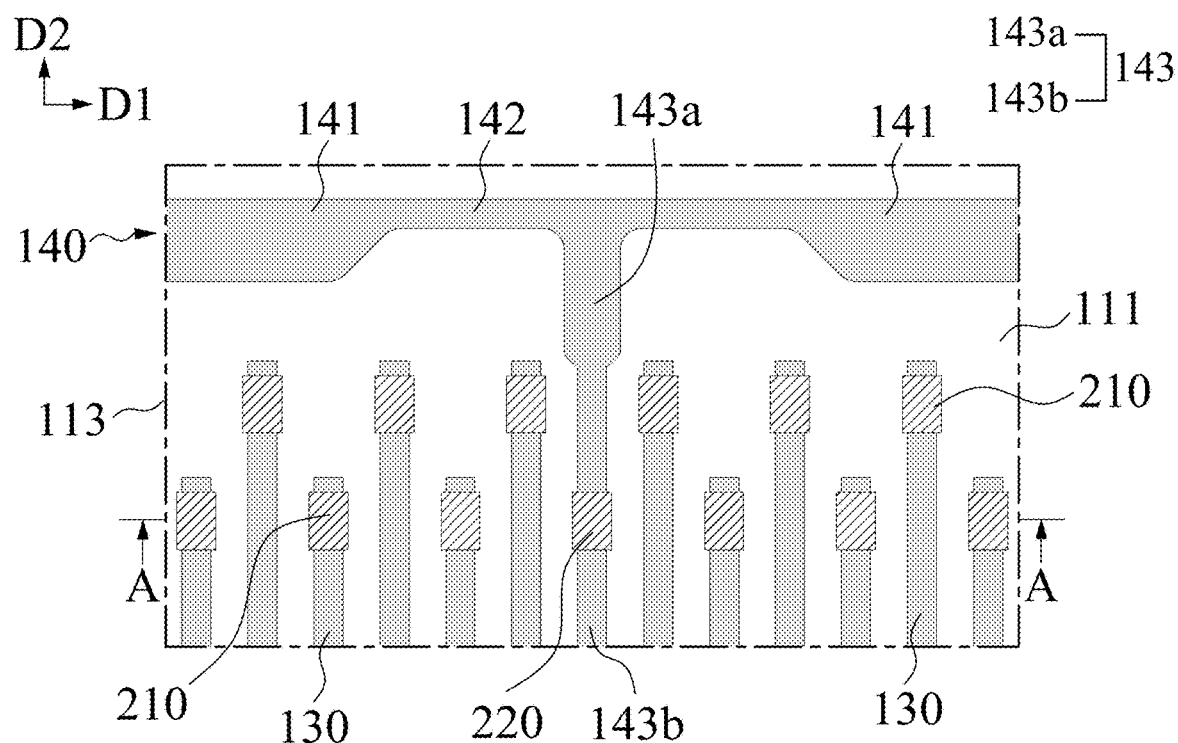
FIG. 7 is a partial top view diagram illustrating an inner bonding area of a circuit board in accordance with an embodiment of the present invention.

FIGS. 5 to 7 show the branch part 143 of different embodiments. The branch part 143 shown in FIG. 5 extends toward one of the inner leads 130 along the longitudinal direction D2, but not connect to the inner lead 130. The branch part 143 shown in FIG. 6 extends to between two adjacent inner leads 130 along the longitudinal direction D2. As shown in FIG. 7, the branch part 143 has a first end 143a and a second end 143b, the first end 143a is connected to the connection part 142, and the second end 143b is a free end used to bond with a bump of the chip 200. The first end 143a is wider than the second end 143b so as to prevent break between the connection part 142 and the branch part 143. Preferably, the second end 143b of the branch part 143 shown in FIG. 7 is located between two adjacent inner leads 130.

With reference to FIGS. 3 to 8, the flip chip package I further includes a solder layer 400 located between the circuit board 100 and the chip 200. The chip 200 includes a plurality of first bumps 210 and at least one second bump 220, the solder layer 400 is provided to connect the first bumps 210 to the inner leads 130 and connect the second bump 220 to the branch part 143. Preferably, the solder layer 400 has a thickness less than or equal to 0.30 μm, and more preferably, the solder layer 400 has a thickness less than or equal to 0.20 μm. In this embodiment, the solder layer 400 having a thickness of 0.16 μm±0.4 μm is involved in the circuit board 100 and is formed on the inner leads 130, the main part 141, the connection part 142 and the branch part 143 of the T-shaped circuit unit 140. By the solder layer 400, the first bumps 210 and the second bump 220 are bonded to the inner leads 130 and the branch part 143, respectively, during thermal compression of the chip 200 on the circuit board 100.

The second end 143b of the branch part 143 is provided for bonding the second bump 220 in the embodiment as shown in FIG. 7. While the chip 200 is bonded to the circuit board 100, the solder layer 400 helps to connect the second bump 220 to the second end 143b of the branch part 143.

Figure 8:
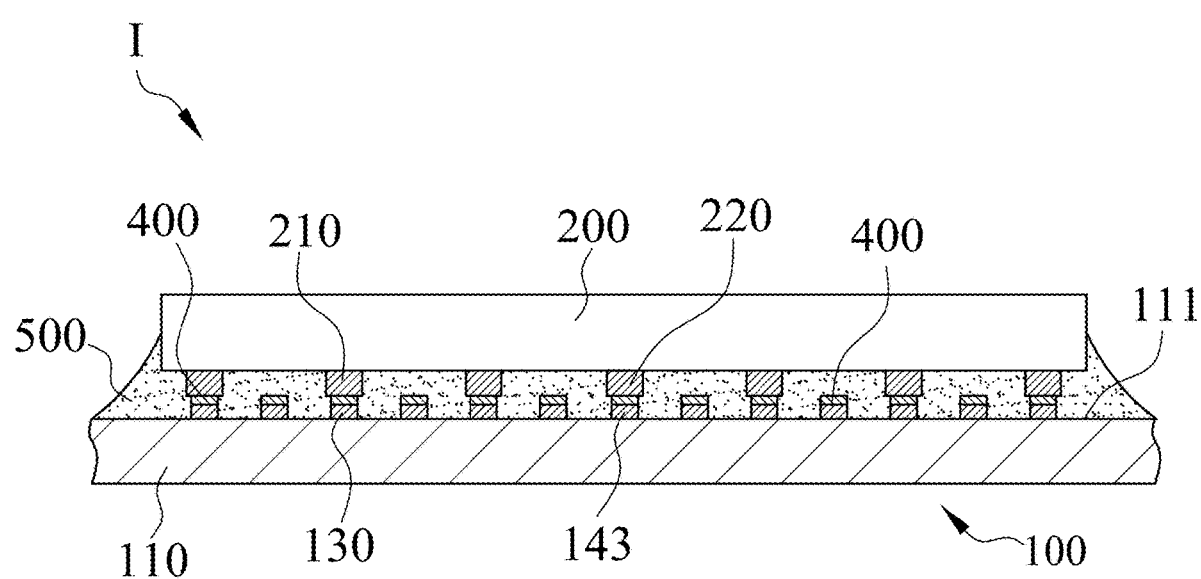
FIG. 8 is a cross-section view diagram of FIG. 7 along line A-A.

With reference to FIG. 8, the flip chip package I preferably further includes an encapsulant 500 filled between the circuit board 100 and the chip 200. The encapsulant 500 is but not limited to an underfill material.

During thermal compression, the solder layer 400 is heated and turned to softened solder having fluidity, and the softened solder layer 400 on the T-shaped circuit unit 140 may flow from different directions to the branch part 143 where is the bonding site of the second bump 220 to increase the possibility of solder overflow. In order to prevent solder short, the present invention focus on layout design of the T-shaped circuit unit 140.

With reference to FIG. 4, along the longitudinal direction D2, the main part 141 has a first width W1 and the connection part 142 has a second width W2 less than the first width W1. Width reduction of the connection part 142 can reduce the amount of solder flowing from the connection part 142 to the branch part 143 effectively such that solder overflow caused by too much solder flowing toward the second bump 220 is prevented. Preferably, the branch part 143 has a third width W3 along the lateral direction D1, and the quotient of the second width W2 and the third width W3 is higher than or equal to $$0.5\left(\frac{W2}{W3} \geq 0.5\right).$$

The quotient is between 0.5 and $$1\left(0.5 \leq \frac{W2}{W3} < 1\right)$$

when the second width W2 is less than the third width W3, the quotient is $$1\left(\frac{W2}{W3} = 1\right)$$

when the second width W2 is equal to the third width W3, and the quotient is higher than $$1\left(\frac{W2}{W3} > 1\right)$$

when the second width W2 is more than the third width W3. In this embodiment, the line width of the branch part 143 is equal to that of the inner leads 130.

With reference to FIG. 5, the second bump 220 has a fourth width W4 along the lateral direction D1, and the quotient of the second width W2 and the fourth width W4 is less than $$2\left(\frac{W2}{W4} < 2\right).$$

The quotient between 1 and $$2\left(1 < \frac{W2}{W4} < 2\right)$$

means the second width W2 is larger than the fourth width W4 but smaller than double of the fourth width W4, the quotient equal to $$1\left(\frac{W2}{W4}=1\right)$$

means the second width W2 is the same as the fourth width W4, and the quotient between 0 and $$1\left(0<\frac{W2}{W4}<1\right)$$

means the second width W2 is less than the fourth width W4. The width of the connection part 142 can be determined according to the width of the second bump 220 to allow the quotient of the second width W2 and the fourth width W4 to be lower than 2.

With reference to FIG. 6, the connection part 142 has a first length L1 along the lateral direction D1 and the second bump 220 has a second length L2 along the longitudinal direction D2. The connection part 142 is not shorter than four times of the second bump 220, in other words, the quotient of the first length L1 and the second length L2 is higher than or equal to $$4\left(\frac{L1}{L2}\geq 4\right).$$

Consequently, the length of the connection part 142 required to be narrowed in width can be determined based on the length of the second bump 220. In the embodiment shown in FIG. 6, the branch part 143 is connected to the center of the connection part 142 so the shortest distance from the branch part 143 to one end of the connection part 142 is the same as the shortest distance from the branch part 143 to the other end of the connection part 142. However, in other embodiments, the branch part 143 may be closer to one end of the connection part 142 than the other end for different design requirements.

With reference to FIG. 6, the shortest distance between the edges of the connection part 142 and the second bump 220 is defined as a linear distance LD. The quotient of the linear distance LD and the second width W2 has to be increased with an increase in the thickness of the solder layer 400, in other words, the thicker the solder layer 400, the higher the quotient of the linear distance LD and the second width W2 so as to prevent solder short caused by too much softened solder flowing to the bonding site of the second bump 200 on the branch part 143 during thermal compression. When the solder layer 400 has a thickness of 0.16 µm, the linear distance LD has to be higher than or equal to three times of the second width W2, consequently, the quotient of the linear distance LD and the second width W2 is not less than $$3\left(\frac{LD}{W2}\geq 3\right).$$

In other design, if the solder layer 400 has a thickness of 0.18 µm, the linear distance LD has to be higher than or equal to four times of the second width W2 so the quotient of the linear distance LD and the second width W2 is not less than $$4\left(\frac{LD}{W2}\geq 4\right).$$

In the present invention, the width of the connection part 142 is decreased to lower the amount of softened solder flowing from the connection part 142 to the branch part 143 in order to decrease the amount of solder flowing from the T-shaped circuit unit 140 to the second bump 220. Furthermore, according to different design requirements, the connection part 142 can be modified in width, length or distance away from the second bump 220 to effectively reduce the possibility of solder overflow and solder short for improving product yield.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A flip chip package comprising:
   a circuit board including a substrate, a plurality of inner leads, and at least one T-shaped circuit unit, wherein an inner bonding area is defined on a surface of the substrate and divided into a first inner bonding area and a second inner bonding area, the inner leads are located on the first inner bonding area, and the at least one T-shaped circuit unit is located on the second inner bonding area, the at least one T-shaped circuit unit includes a main part, a connection part, and a branch part, the main part is connected to the connection part and extends along a lateral direction, the branch part is connected to the connection part and extends toward the first inner bonding area along a longitudinal direction, the main part has a first width along the longitudinal direction, and the connection part has a second width less than the first width along the longitudinal direction;
   a chip mounted on the inner bonding area and including a plurality of first bumps and at least one second bump; and
   a solder layer located between the circuit board and the chip, the solder layer is provided to connect the first bumps to the inner leads and connect the at least one second bump to the branch part.

2. The flip chip package in accordance with claim 1, wherein the branch part extends toward one of the inner leads along the longitudinal direction.

3. The flip chip package in accordance with claim 1, wherein the branch part extends to between two of the inner leads along the longitudinal direction.

4. The flip chip package in accordance with claim 1, wherein the branch part has a first end and a second end, the first end is connected to the connection part and the second end is bonded to the at least one second bump, the first end is wider than the second end.

5. The flip chip package in accordance with claim 1, wherein the branch part has a third width along the lateral direction, and a quotient of the second and third widths is higher than or equal to 0.5.

6. The flip chip package in accordance with claim 1, wherein the at least one second bump has a fourth width along the lateral direction, and a quotient of the second and fourth widths is less than 2.

7. The flip chip package in accordance with claim 6, wherein the second width is equal to the fourth width.

8. The flip chip package in accordance with claim 6, wherein the connection part has a first length along the lateral direction and the at least one second bump has a second length along the longitudinal direction, a quotient of the first and second lengths is higher than or equal to 4.

9. The flip chip package in accordance with claim 1, wherein a quotient of a linear distance from the connection part to the at least one second bump and the second width is higher than or equal to 3.

10. The flip chip package in accordance with claim 1, wherein the solder layer has a thickness less than or equal to 0.30 μm.

11. A circuit board, comprising:
a substrate having a surface, an inner bonding area is defined on the surface and divided into a first inner bonding area and a second inner bonding area;
a plurality of inner leads located on the first inner bonding area; and
at least one T-shaped circuit unit located on the second inner bonding area and including a main part, a connection part and a branch part, the main part is connected to the connection part and extends along a lateral direction, the branch part provided for bonding a bump is connected to the connection part and extends toward the first inner bonding area along a longitudinal direction, the main part has a first width along the longitudinal direction and the connection part has a second width less than the first width along the longitudinal direction.

12. The circuit board in accordance with claim 11, wherein the branch part extends toward one of the inner leads along the longitudinal direction.

13. The circuit board in accordance with claim 11, wherein the branch part extends to between two of the inner leads along the longitudinal direction.

14. The circuit board in accordance with claim 11, wherein the branch part has a first end and a second end, the first end is connected to the connection part and the second end is provided to bond with the bump, the first end is wider than the second end.

15. The circuit board in accordance with claim 11, wherein the branch part has a third width along the lateral direction, and a quotient of the second and third widths is higher than or equal to 0.5.

16. The circuit board in accordance with claim 11 further comprising a solder layer, wherein the solder layer is formed on the branch part and provided to connect the branch part and the bump.

17. The circuit board in accordance with claim 16, wherein the solder layer has a thickness less than or equal to 0.30 μm.

* * * * *